(12) United States Patent  (10) Patent No.: US 12,478,264 B2
Hsu et al.  (45) Date of Patent: Nov. 25, 2025

(54) SYSTEM FOR SENSING ARTERIAL PULSE WAVEFORM (71) Applicant: RENSSELAER POLYTECHNIC INSTITUTE, Troy, NY (US)

(72) Inventors: Yu-Pin Hsu, Santa Clara, CA (US); Zemin Liu, Santa Clara, CA (US); Mona Mostafa Hella, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 1003 days.

(21) Appl. No.: 17/622,280

(22) PCT Filed: Jun. 26, 2020

(86) PCT No.: PCT/US2020/039880
§ 371 (c)(1),
(2) Date: Dec. 23, 2021

(87) PCT Pub. No.: WO2021/034408
PCT Pub. Date: Feb. 25, 2021

(65) Prior Publication Data
US 2022/0257126 A1  Aug. 18, 2022

Related U.S. Application Data (60) Provisional application No. 62/934,496, filed on Nov. 12, 2019, provisional application No. 62/867,614, filed on Jun. 27, 2019.

(51) Int. Cl.
A61B 5/021 (2006.01)
A61B 5/00 (2006.01)
(Continued)

(52) U.S. Cl.
CPC ........ *A61B 5/02108* (2013.01); *A61B 5/6802* (2013.01); *A61B 5/7225* (2013.01);
(Continued)

(58) Field of Classification Search
CPC . A61B 5/02108; A61B 5/6802; A61B 5/7225; A61B 5/7203; A61B 5/7214;
(Continued)

(56) References Cited

U.S. PATENT DOCUMENTS 5,178,151 A  1/1993  Sackner
5,605,156 A  2/1997  Drzewiecki
(Continued)

FOREIGN PATENT DOCUMENTS

WO  2014104266 A1  7/2014

OTHER PUBLICATIONS

International Search Report and The Written Opinion of the International Searching Authority, International Application No. PCT/US2020/039880, mailed Mar. 19, 2021.
(Continued)

*Primary Examiner* — Devin B Henson
(74) *Attorney, Agent, or Firm* — Barclay Damon LLP; Anthony P. Gangemi (57) ABSTRACT One embodiment provides an offset calibration circuitry configured to compensate an offset voltage of a resistive bridge sensor. The offset calibration circuitry includes a first current digital to analog converter (IDAC) coupled to a first successive approximation register (SAR), a second IDAC coupled to a second SAR and an SAR controller circuitry. The first IDAC is configured to couple to a negative voltage port of a resistive bridge sensor. The first SAR is configured to store a first digital value. The second IDAC is configured to couple to a positive voltage port of the resistive bridge sensor. The second SAR is configured to store a second
(Continued)

digital value. The SAR controller circuitry is configured to adjust each bit of the first SAR and each bit of the second SAR based, at least in part, on an output of a comparator. The comparator is configured to compare a voltage on the negative voltage port or a voltage on the positive voltage port to a common mode voltage.

19 Claims, 7 Drawing Sheets

(51) Int. Cl.
*H03M 1/10* (2006.01)
*H03M 1/46* (2006.01)
(52) U.S. Cl.
CPC ......... *H03M 1/1023* (2013.01); *H03M 1/466* (2013.01); *A61B 2560/0252* (2013.01); *A61B 2560/0257* (2013.01); *A61B 2560/0261* (2013.01)
(58) Field of Classification Search
CPC .............. A61B 5/7221; A61B 5/02156; A61B 2560/0252; A61B 2560/0257; A61B 2560/0261; A61B 2560/0223; H03M 1/1023; H03M 1/466; H03M 1/0607; H03M 1/356; H03M 1/384
See application file for complete search history.

(56) References Cited

U.S. PATENT DOCUMENTS

| | | | |
|---|---|---|---|
| 5,799,337 A | 9/1998 | Brown | |
| 6,148,933 A | 11/2000 | Hay | |
| 6,159,166 A | 12/2000 | Chesney | |
| 6,226,322 B1 | 5/2001 | Mukherjee | |
| 6,256,825 B1 | 7/2001 | Hwang | |
| 6,313,779 B1 | 11/2001 | Leung et al. | |
| 6,538,594 B1 * | 3/2003 | Somayajula | H03M 1/1023 341/172 |
| 6,544,188 B1 | 4/2003 | Chesney | |
| 7,185,781 B2 | 3/2007 | Pitts | |
| 7,465,274 B2 | 12/2008 | Amano | |
| 8,326,928 B2 | 12/2012 | Slotznick | |
| 8,638,248 B2 | 1/2014 | Wu et al. | |
| 8,666,472 B2 | 3/2014 | Maltz | |
| 8,723,656 B2 | 5/2014 | Ferringo | |
| 9,413,375 B2 | 8/2016 | Jiang | |
| 9,455,737 B1 * | 9/2016 | Rajaee | H03M 3/464 |
| 9,584,164 B1 | 2/2017 | Sheikh | |
| 9,722,843 B2 | 8/2017 | Ling | |
| 9,750,429 B1 | 9/2017 | Sackner | |
| 9,833,151 B2 | 12/2017 | Wiard | |
| 9,887,644 B2 | 2/2018 | Kim | |
| 10,097,169 B1 * | 10/2018 | Pan | H03F 3/45995 |
| 10,299,735 B2 | 5/2019 | Furness, III | |
| 10,565,790 B2 | 2/2020 | Kaehler | |
| 10,585,497 B2 | 3/2020 | Park | |
| 10,705,619 B2 | 7/2020 | Johri | |
| 12,209,265 B2 | 1/2025 | Terrell | |
| 12,209,273 B2 | 1/2025 | Bava | |
| 12,209,279 B2 | 1/2025 | Huo | |
| 2007/0188219 A1 | 8/2007 | Segarra | |
| 2009/0322579 A1 * | 12/2009 | Matsuda | H03M 1/0607 341/158 |
| 2010/0201570 A1 | 8/2010 | Shemar | |
| 2011/0018605 A1 * | 1/2011 | Cho | H03M 1/1023 327/307 |
| 2011/0193623 A1 | 8/2011 | Yazicioglu | |
| 2012/0289809 A1 | 11/2012 | Kaib | |
| 2014/0118498 A1 | 5/2014 | Lee | |
| 2015/0236648 A1 | 8/2015 | Ahmad et al. | |
| 2015/0333718 A1 | 11/2015 | Lemkin | |
| 2016/0242645 A1 | 8/2016 | Muller | |
| 2016/0249846 A1 | 9/2016 | Yoo | |
| 2018/0167078 A1 * | 6/2018 | Ding | H03M 1/468 |
| 2018/0263521 A1 | 9/2018 | Stordopoulos | |

OTHER PUBLICATIONS

International Search Report and The Written Opinion of the International Searching Authority, International Application No. PCT/US2019/061122, mailed Jan. 31, 2020, 7 pages.

* cited by examiner

```
┌─────────────────────────────────────────┐
│ Couple a noninverting input of a comparator to an output of a
│ first current digital to analog converter (IDAC) and a negative
│ voltage port of the resistive bridge sensor
│ 602
└─────────────────────────────────────────┘
```

Adjust each bit of the first SAR based, at least in part, on an output of the comparator
604

Decouple the noninverting input to the comparator from the output of the first IDAC and from the negative voltage port
606

Couple the noninverting input of the comparator to an output of a second IDAC and a positive voltage port of the resistive bridge sensor
608

Adjust each bit of the second SAR based, at least in part, on an output of the comparator
610

Decouple the noninverting input to the comparator from the output of the second IDAC and from the positive voltage port
612

SYSTEM FOR SENSING ARTERIAL PULSE WAVEFORM

CROSS REFERENCE TO RELATED APPLICATION(S)

This application claims the benefit of U.S. Provisional Application No. 62/867,614, filed Jun. 27, 2019, and U.S. Provisional Application No. 62/934,496, filed Nov. 12, 2019, which are incorporated by reference as if disclosed herein in their entireties.

GOVERNMENT LICENSE RIGHTS

This invention was made with government support under award number N68335-16-C-0117, awarded by the Office of Naval Research. The government has certain rights in the invention.

FIELD

The present disclosure relates to a system, in particular to, a system for sensing an arterial pulse waveform.

BACKGROUND

The blood pressure waveform is a fundamental medical signal that can provide important information useful for diagnosis of cardiovascular disease. A majority of blood pressure detection systems are configured to capture pulse wave velocity (PWV) and/or arterial pulse waveform (APW) information at the wrist or the finger. In some systems, PWV and/or APW detection is based on light sensing. Such light sensing systems may have a dc power consumption ranging from about 25 µW (microwatts) to about 1280 µW, depending on a specific circuit architecture. Other approaches that may be used to detect cardiovascular disease include ultrasound, catheterization, electrocardiogram (ECG) with photoplethysmography (PPG), and impedance-based measurements. One or more of cost, complexity, ease-of-use, and level of comfort for long-term monitoring vary depending on the specific approach.

SUMMARY

In some embodiments, there is provided an offset calibration circuitry configured to compensate an offset voltage of a resistive bridge sensor. The offset calibration circuitry includes a first current digital to analog converter (IDAC) coupled to a first successive approximation register (SAR), a second IDAC coupled to a second SAR and an SAR controller circuitry. The first IDAC is configured to couple to a negative voltage port of a resistive bridge sensor. The first SAR is configured to store a first digital value. The second IDAC is configured to couple to a positive voltage port of the resistive bridge sensor. The second SAR is configured to store a second digital value. The SAR controller circuitry is configured to adjust each bit of the first SAR and each bit of the second SAR based, at least in part, on an output of a comparator. The comparator is configured to compare a voltage on the negative voltage port or a voltage on the positive voltage port to a common mode voltage. In some embodiments of the offset calibration circuitry, the comparator is switchably coupled to the negative voltage port or to the positive voltage port during calibration operations and is decoupled from the negative voltage port and the positive voltage port otherwise.

In some embodiments of the offset calibration circuitry, the first digital value corresponds to a first compensation current and the second digital value corresponds to a second compensation current, the compensation currents related to at least one offset voltage of the resistive bridge sensor.

In some embodiments of the offset calibration circuitry, the SAR controller circuitry is configured to initiate the adjusting in response to a reset signal. In some embodiments of the offset calibration circuitry, the common mode voltage is configured to be one half of a supply voltage. In some embodiments of the offset calibration circuitry, each bit is adjusted in a respective clock period. In some embodiments of the offset calibration circuitry, each SAR contains seven bits.

In some embodiments, there is provided a method of offset calibration for a resistive bridge sensor. The method includes coupling, by a first switch, a noninverting input of a comparator to an output of a first current digital to analog converter (IDAC) and a negative voltage port of the resistive bridge sensor. The first IDAC is coupled to a first successive approximation register (SAR). The method further includes adjusting, by an SAR controller circuitry, each bit of the first SAR based, at least in part, on an output of the comparator. The comparator is configured to compare a voltage on the negative voltage port to a common mode voltage. The method further includes decoupling, by the first switch, the noninverting input to the comparator from the output of the first IDAC and from the negative voltage port. The method further includes coupling, by a second switch, the noninverting input of the comparator to an output of a second IDAC and a positive voltage port of the resistive bridge sensor. The second IDAC is coupled to a second SAR. The method further includes adjusting, by the SAR controller circuitry, each bit of the second SAR based, at least in part, on an output of the comparator. The comparator is configured to compare a voltage on the positive voltage port to the common mode voltage. The method further includes decoupling, by the second switch, the noninverting input to the comparator from the output of the second IDAC and from the positive voltage port.

In some embodiments of the method, the resistive bridge sensor is configured to sense pressure, humidity or temperature. In some embodiments of the method, each bit is adjusted in a respective clock period.

In some embodiments of the method, after the adjusting, the first SAR is configured to store a first digital value corresponding to a first compensation current and the second SAR is configured to store a second digital value corresponding to a second compensation current. The compensation currents are related to at least one offset voltage of the resistive bridge sensor.

In some embodiments of the method, the adjusting is initiated in response to a reset signal. In some embodiments of the method, each SAR contains seven bits.

In some embodiments, there is provided an arterial pulse waveform sensing system. The arterial pulse waveform sensing system includes a front end circuitry, an instrumentation amplifier configured to couple to the negative voltage port and the positive voltage port of the resistive bridge sensor, a low pass filter with a duty cycle controlled bandwidth, and an analog to digital converter.

The front end circuitry includes an offset calibration circuitry. The offset calibration circuitry includes a first current digital to analog converter (IDAC) coupled to a first successive approximation register (SAR), a second IDAC coupled to a second SAR and an SAR controller circuitry. The first IDAC is configured to couple to a negative voltage port of a resistive bridge sensor. The first SAR is configured to store a first digital value. The second IDAC is configured to couple to a positive voltage port of the resistive bridge sensor. The second SAR is configured to store a second digital value. The SAR controller circuitry is configured to adjust each bit of the first SAR and each bit of the second SAR based, at least in part, on an output of a comparator. The comparator is configured to compare a voltage on the negative voltage port or a voltage on the positive voltage port to a common mode voltage.

In some embodiments of the arterial pulse waveform sensing system, the front end circuitry further includes bandgap (BGP) circuitry, buffer circuitry, and low drop out (LDO) circuitry configured to provide a temperature independent supply voltage.

In some embodiments, the arterial pulse waveform sensing system further includes a resistive bridge pressure sensor.

In some embodiments of the arterial pulse waveform sensing system, the SAR controller circuitry is further configured to provide a duty cycle control signal to the low pass filter.

In some embodiments of the arterial pulse waveform sensing system, the comparator is switchably coupled to the negative voltage port or to the positive voltage port during calibration operations and is decoupled from the negative voltage port and the positive voltage port otherwise.

In some embodiments of the arterial pulse waveform sensing system, the first digital value corresponds to a first compensation current and the second digital value corresponds to a second compensation current. The compensation currents are related to at least one offset voltage of the resistive bridge circuitry.

In some embodiments of the arterial pulse waveform sensing system, each bit is adjusted in a respective clock period.

BRIEF DESCRIPTION OF DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

Although the following Detailed Description will proceed with reference being made to illustrative embodiments, many alternatives, modifications, and variations thereof will be apparent to those skilled in the art.

DETAILED DESCRIPTION

PWV and/or APW at, for example, the neck, may be obtained using a discrete resistive-bridge sensing technique. Such a discrete resistive-bridge sensing technique can provide relatively more accurate clinical data compared to the other techniques. A resistive bridge may draw a current that ranges from several µA to several hundred µA based, at least in part, on sensor resistance. Bridge type sensors may be utilized in a variety of sensing applications including, but not limited to, temperature, humidity, pressure, etc. Such bridge type sensors are generally relatively low cost, relatively easy to use and, in some situations, may be considered disposable. Bridge type sensors may suffer from a DC offset that results in a nonzero differential output when the bridge type sensor is not loaded. Such DC offset may be affected by, for example, process variations, atmospheric pressure, temperature, etc. Such offset may limit a linear range of the corresponding sensing system.

Generally, this disclosure relates to an arterial pulse waveform sensing system. The arterial pulse waveform sensing system is configured to sense an arterial pressure waveform noninvasively via a resistive bridge pressure sensor positioned on a test subject. The pressure sensor may be positioned on a surface of the test subject's skin over an artery. In one nonlimiting example, the pressure sensor may be coated with a soft biocompatible material, e.g. silicone, for comfortable skin attachment, to facilitate relatively long term monitoring. The pressure sensor may be positioned, for example, on the test subject's neck, wrist and/or finger. However, this disclosure is not limited in this regard. When the sensor module is attached, e.g., adhered, to the test subject's skin surface, the sensor module may detect APW via the skin surface coupling.

In the following, offset calibration is described with respect to a bridge type pressure sensor. However, it is contemplated that such offset calibration may be applied to bridge sensors configured to detect other parameters (e.g., temperature, humidity, etc.), within the scope of the present disclosure.

An apparatus, method, and/or system may be configured to implement automatic offset calibration of the pressure sensor to compensate for a voltage offset that may be associated with a discrete resistive bridge pressure sensor. The offset calibration may be triggered by, for example, a reset signal from a system control module. At least a portion of the offset calibration circuitry may then be decoupled from the sensing system for normal operation. Such decoupling is configured to reduce system power consumption during normal operation.

In an embodiment, the offset calibration circuitry may include a plurality of successive approximation registers (SARs), a plurality of current digital to analog converters (IDACs), a plurality of switches, a comparator, and an SAR controller circuitry. The SAR controller circuitry may be configured to initiate offset calibration in response to a reset signal. Offset calibration may then be performed synchronously based, at least in part, on a clock signal. For example, a number of SARs and a number of IDACs may be 2, with each SAR coupled to a respective IDAC. The comparator may be configured to receive a common mode voltage (VCM). In one nonlimiting example, the common mode voltage may correspond to one half the supply voltage to the resistive bridge.

In operation, a first IDAC may be coupled to a negative terminal of a resistive bridge and a second IDAC may be coupled to a positive terminal of the resistive bridge. The SAR controller circuitry may then be configured to adjust (e.g., set or clear) each bit of a plurality of bits of a respective SAR based, at least in part, on an output of the comparator, i.e., based, at least in part, on a comparison of the resistive bridge voltage output value and the common mode voltage. At the completion of the calibration operations, the binary contents of each SAR corresponds to a respective offset voltage of a portion of the resistive bridge. The contents of each SAR are configured as a digital input to the respective IDAC and an output current of the respective IDAC is configured to compensate for the resistive bridge respective offset voltage of at least one leg of the resistive bridge. In one nonlimiting example, a resulting calibrated (i.e., compensated) offset voltage may be approximately one millivolt (mV).

Additionally or alternatively, an apparatus, method, and/or system may include a relatively highly linear instrumentation amplifier (IA) that may include a super class AB output stage. Additionally or alternatively, an apparatus, method, and/or system may include a low-pass filter (LPF)—analog to digital converter (ADC) architecture configured to extract and/or digitize the APW in a 100 Hz (Hertz) bandwidth. The LPF is configured with variable gain and a variable bandwidth. The gain may be set by selecting a resistance value of variable input resistors and the bandwidth may be set by selecting a duty cycle of switch control signals of switches included in the feedback path of the LPF. The ADC may be configured to use an SAR control logic corresponding to the SAR control circuitry of the offset calibration circuitry. Such architecture is configured to reduce a size of an area occupied by passive circuit elements by approximately 90%.

Thus, an apparatus, method and/or system, according to the present disclosure, may be relatively low power, have a relatively small form factor and may be relatively inexpensive. The apparatus, method and/or system may then be configured to be worn by a test subject in order to capture, for example, an APW.

Figure 1:
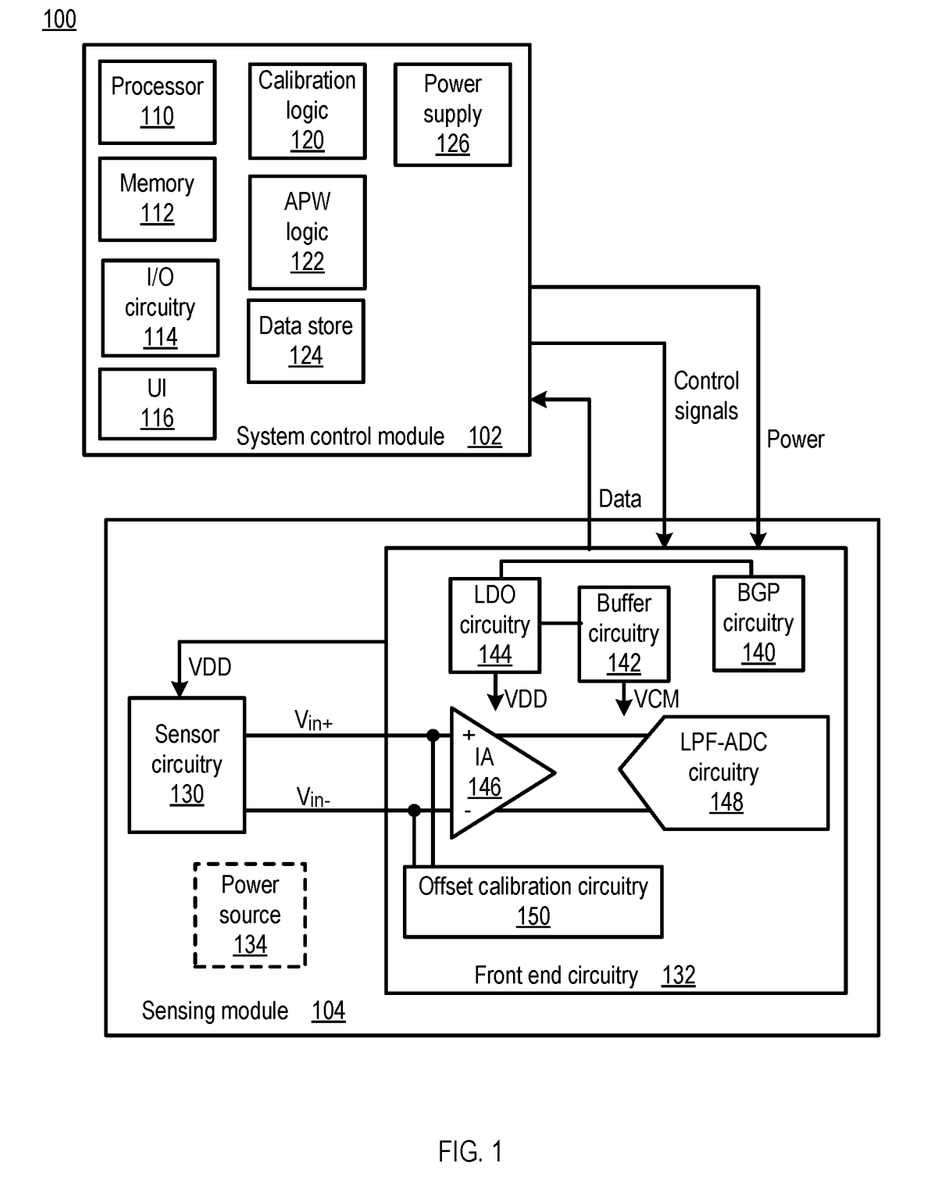
FIG. 1 illustrates a functional block diagram of an arterial pulse waveform sensing system, according to several embodiments of the present disclosure.

FIG. 1 illustrates a functional block diagram of an arterial pulse waveform sensing system 100 consistent with several embodiments of the present disclosure. System 100 includes a system control module 102 and a sensing module 104. In some embodiments, system 100 may include a plurality of sensing modules, e.g., a plurality of sensing modules 104. For example, system 100 may be configured to sense the APW at a plurality of locations.

System control module 102 may be configured to provide one or more control signals to sensing module 104, as will be described in more detail below. In some embodiments, system control module 102 may be configured to provide power to sensing module 104. Power may include, for example, a supply voltage for sensing module 104. In some embodiments, sensing module 104 may include a power source 134, e.g., a battery. System control module 102 may be configured to receive arterial pulse waveform data from sensing module 104. Sensing module 104 may be positioned on a human test subject, for example, on the test subject's neck and/or wrist, in order to sense a corresponding arterial pulse waveform.

System control module 102 may include, but is not limited to, a smart phone, a wearable device (e.g., wearable computer, "smart" watches, smart glasses, etc.) and/or system, a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer, etc.

System control module 102 includes a processor 110, a memory 112, input/output (I/O) circuitry 114 and a user interface (UI) 116. System control module 102 may further include calibration logic 120, arterial pulse waveform logic 122, a data store 124 and a power supply 126.

Processor 110 may include one or more processing units and is configured to perform operations of system control module 102, e.g., operations of calibration logic 120, and/or arterial pulse waveform logic 122. Memory 112 may be configured to store data and/or configuration parameters associated with sensing module 104. I/O circuitry 114 may be configured to communicate wired and/or wirelessly with sensing module 104 and/or a patient management system. UI 116 may include a user input device (e.g., keyboard, mouse, microphone, touch sensitive display, etc.) and/or a user output device, e.g., a display. Data store 124 may be configured to store sensed arterial pulse waveform data and/or configuration parameters. Power supply 126 may be configured to receive, e.g., line voltage, and to provide power (e.g., a DC voltage) to sensing module 104. In some embodiments, sensing module 104 may include and/or may be coupled to a battery (e.g., power source 134) configured to power the sensing module 104.

Sensing module 104 includes sensor circuitry 130 and front end circuitry 132. In an embodiment, the front end circuitry 132 may be configured as an integrated circuit (IC). In an embodiment, sensor circuitry 130 may be coupled to the front end circuitry 132. In another embodiment, sensor circuitry 130 may be included in the front end circuitry 132.

Sensor circuitry 130 may be configured as a resistive bridge, as will be described in more detail below. Sensor circuitry 130 may include, but is not limited to, a temperature sensor, a humidity sensor, a pressure sensor, etc. For example, sensor circuitry 130 may correspond to a resistive bridge pressure sensor. In this example, the sensor circuitry 130 may include a silicone coating configured to provide packaging for the resistive bridge pressure sensor and thus comfort to a test subject.

Front end circuitry 132 is configured to receive one or more control signals from system control module 102. Control signals may include, but are not limited to, a clock signal (CLK), a gain indicator, a bandwidth indicator and/or a reset signal (RST). For example, calibration logic 120 may be configured to provide the reset (RST) signal to sensing module 104 configured to trigger offset calibration operations. APW logic 122 may be configured to receive a digital representation of a captured APW waveform. APW logic 122 may be further configured to provide the gain indicator and/or the bandwidth indicator. In some embodiments, front end circuitry 132 may be configured to receive power from the system control module 102. Front end circuitry 132 may be further configured to provide data to the system control module 102. In one nonlimiting example, the data may correspond to a digital representation of a sensed APW.

Front end circuitry 132 may be configured to provide a supply voltage, $V_{DD}$, to sensor circuitry 130. Front end circuitry 132 is configured to couple to a negative voltage port Vin− and a positive voltage port Vin+ of sensor circuitry 130 and to receive a differential input voltage, Vin+, Vin− from sensor circuitry 130. Vin+ and Vin− may each be referenced to ground. However, this disclosure is not limited in this regard. The differential input voltage may correspond to a parameter (e.g., pressure) sensed by sensor circuitry 130 and may include an offset voltage. A difference between Vin+ and Vin− when the sensor circuitry 130 is in a neutral state (e.g., not sensing pressure) corresponds to the offset voltage.

Front end circuitry 132 includes bandgap (BGP) circuitry 140, buffer circuitry 142, and low drop out (LDO) circuitry 144. Front end circuitry 132 may further include an instrumentation amplifier (IA) 146 and a low pass filter—analog to digital converter (LPF-ADC) circuitry 148. In some embodiments, the front end circuitry 132 further includes offset calibration circuitry 150.

BGP circuitry 140 corresponds to a bandgap voltage reference. In an embodiment, BGP circuitry may be configured to receive power from system control module 102. A bandgap voltage reference is configured to be temperature independent. BGP circuitry 140 is configured to produce a constant voltage in the presence of, for example, power supply variations, temperature changes and circuit loading. LDO circuitry 144 is configured to provide a supply voltage $V_{DD}$ to sensor circuitry 130. For example, the supply voltage may be about 1.8 volts. However this disclosure is not limited in this regard. LDO circuitry 144 is configured to regulate the supply voltage and may provide adequate regulation even when the supply voltage is relatively close to the output voltage. It may be appreciated that LDO circuitry 144 is configured to operate without switching noise, has a relatively small device size, and is configured to have a relatively simple design. Buffer circuitry 142 is configured to receive an input voltage (e.g., $V_{DD}$) from LDO circuitry 144 and to provide as output a common mode voltage, $V_{CM}$. In one nonlimiting example, the common mode voltage $V_{CM}$ may be one half of the supply voltage $V_{DD}$. Thus, BGP circuitry 140, buffer circuitry 142, and LDO circuitry 144 are configured to provide temperature independent supply voltages for both the sensor circuitry 130 and the front-end circuitry 132, configured to eliminate potential temperature drift in the supply voltages.

IA 146 is configured to receive differential input voltages Vin+ and Vin− from sensor circuitry 130 and to provide an amplified differential voltage output to LPF-ADC circuitry 148. Offset calibration circuitry 150 may be coupled to the input ports (inverting and noninverting) of the IA 146. The IA 146 includes a differential-difference amplifier (DDA) in a resistive-feedback configuration, as will be described in more detail below. The resistive feedback is configured to provide a relatively higher linearity compared to capacitive feedback. The IA 146 may further include a super class-AB output stage configured to provide a relatively high driving capability for both the resistive feedback in the IA 146, and the LPF-ADC circuitry 148 without the penalty of high power consumption. In some embodiments, a chopping function may be used to remove 1/f noise and an offset that may be associated with the DDA in order to achieve a relatively low-noise performance.

In some embodiments, the LPF-ADC circuitry 148 may be configured to have a 100 Hz bandwidth. However, this disclosure is not limited in this regard. In some embodiments, a successive approximation register (SAR)-based control logic may be shared between the ADC and a duty-cycle controlled filter. In some embodiment, when a sampling frequency $\omega_s$ of the ADC is larger than $1/R_f C_f$, the filter may be configured to implement a bandwidth of $d/R_f C_f$ through a duty cycle control method, where d ($0<d\leq1$) is the duty-cycle ratio of the control clock.

Thus, sensing system 100 may include a sensing module 104 configured to be relatively low power, have a relatively small form factor and may be relatively inexpensive. The sensing module 104 may then be configured to be worn by a test subject in order to capture, for example, an APW.

Figure 2A:
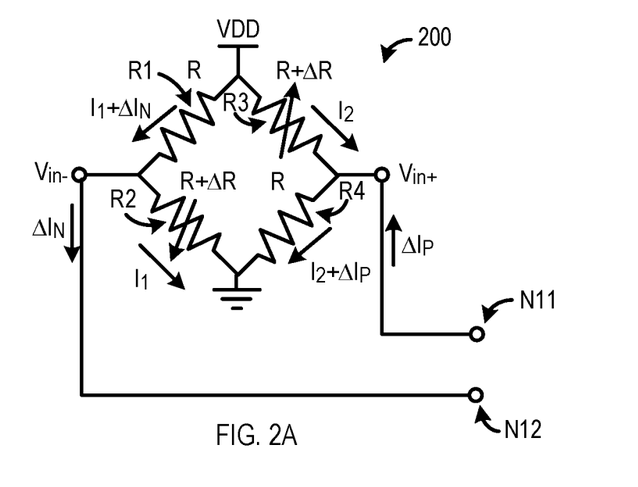
FIGS. 2A through 2D illustrate respective portions of a sensing module including an automatic bridge-offset calibration circuitry, according to an embodiment of the present disclosure.
Figure 2B:
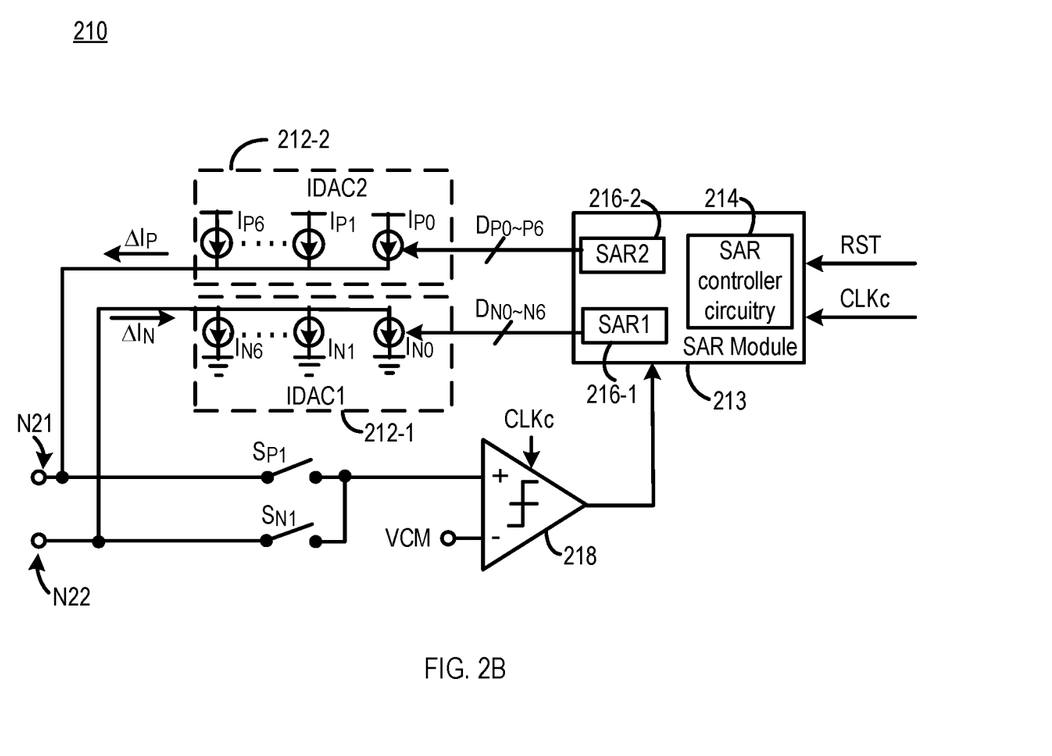
Figure 2C:
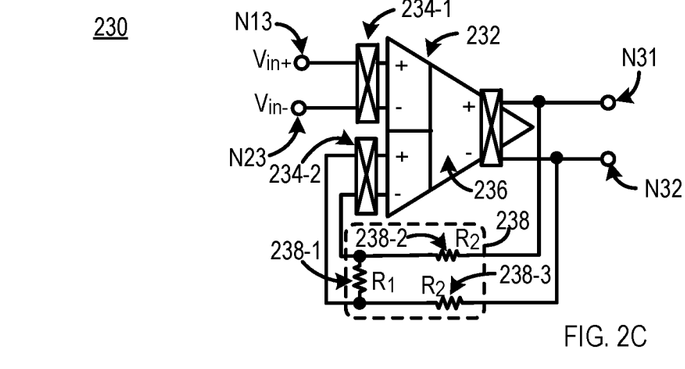
Figure 2D:
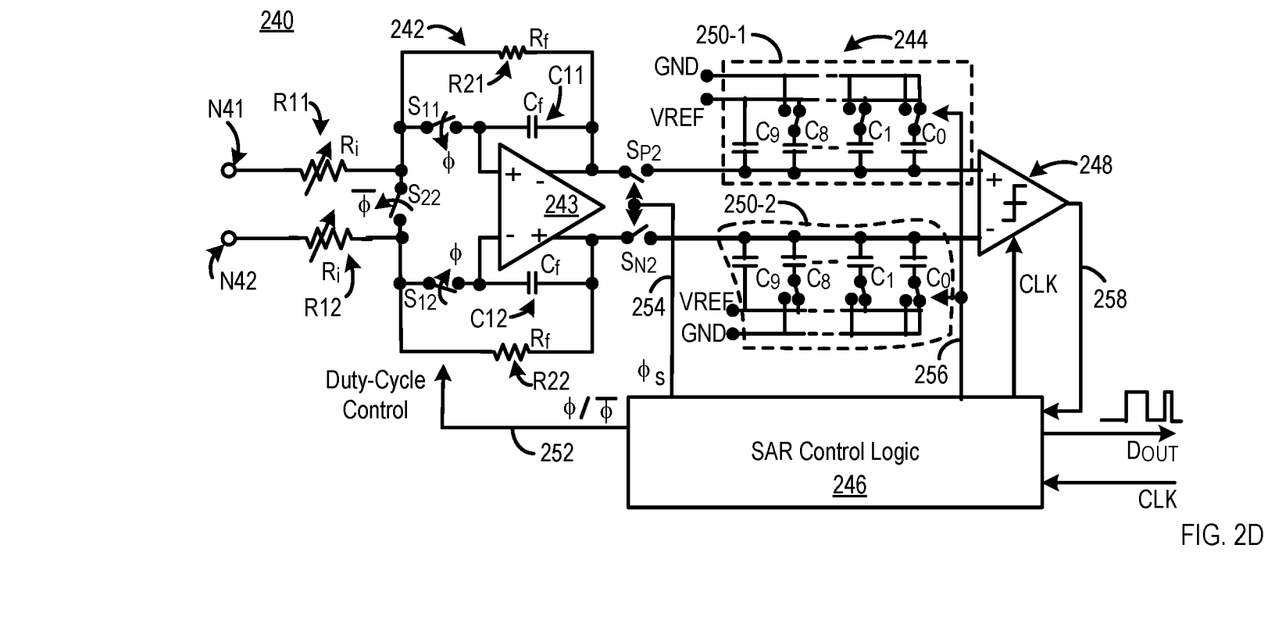

FIGS. 2A through 2D illustrate respective portions of a sensing module including an automatic bridge-offset calibration circuitry, according to an embodiment of the present disclosure. In particular, FIG. 2A illustrates one example resistive bridge sensor 200, FIG. 2B illustrates one example offset calibration circuitry 210, FIG. 2C illustrates one example instrumentation amplifier (IA) 230, and FIG. 2D illustrates one example LPF-ADC architecture 240. FIGS. 2A through 2D may be best understood when considered together.

Turning now to FIG. 2A, resistive bridge sensor 200 includes four resistors R1, R2, R3, R4 coupled in a bridge configuration. The resistive bridge sensor 200 is coupled between a supply voltage, $V_{DD}$, and ground. A first resistor, R1, having resistance value R, is coupled between the supply voltage and a negative output port, Vin−. A second resistor, R2, is coupled between the negative port, Vin−, and ground. The second resistor, R2, has resistance value R+ΔR. A third resistor, R3, is coupled between the supply voltage and a positive output port, Vin+. The third resistor, R3, has resistance value R+ΔR. A fourth resistor, R4, having resistance value R, is coupled between the positive output port, Vin+ and ground. The positive output port, Vin+, is coupled to a first interconnect node, N11, and the negative output port, Vin−, is coupled to a second interconnect node, N12. It may be appreciated that the interconnect nodes are included for ease of description of the interconnections between the portions of the sensing module.

In operation, a resistance of at least one resistor of a resistive bridge sensor may change in response to an external stimulus. The change in resistance(s) may result in a change in Vin+ and/or Vin−, that may then be sensed by a front end circuitry, for example, front end circuitry 132 of FIG. 1. It may be appreciated that a nonzero offset voltage may reduce a linear range of operation of a sensing system and/or may saturate an instrumentation amplifier thus degrading operation of the sensing system. Offset calibration circuitry, e.g., offset calibration circuitry 150 of FIG. 1, may be configured to compensate for such offset.

Turning now to FIG. 2B, offset calibration circuitry 210 is one example of offset calibration circuitry 150 of FIG. 1. Offset calibration circuitry 210 is configured to be coupled to sensor circuitry 200. For example, interconnect node N21 may be coupled to interconnect node N11 and interconnect node N22 may be coupled to interconnect node N12.

Offset calibration circuitry 210 includes a first current digital to analog converter (IDAC1) 212-1, a second current digital to analog converter (IDAC2) 212-2, a successive approximation register (SAR) module 213, a comparator 218, and two switches $S_{P1}$ and $S_{N1}$. SAR module 213 includes an SAR controller circuitry 214, a first successive approximation register (SAR1) 216-1, and a second successive approximation register (SAR2) 216-2. SAR1 is coupled to IDAC1 and SAR2 is coupled to IDAC2. SAR module 213 is coupled to an output of comparator 218. A first (noninverting) input of comparator 218 is coupled to switches $S_{P1}$ and $S_{N1}$. A second (inverting) input of comparator 218 is coupled to a common mode voltage ($V_{CM}$). An output of IDAC1 212-1 is coupled to interconnect node N22 and to the negative voltage port Vin− via interconnect node N12. An output of IDAC2 2122 is coupled to interconnect node N21 and to the positive voltage port Vin+ via interconnect node N11. Thus, offset calibration circuitry 210 may be coupled to resistive bridge sensor 200.

IDAC1 212-1 is configured to sink a first offset compensation current, $\Delta I_N$, from the negative voltage port, Vin−, of the resistive bridge sensor 200. The first offset compensation current $\Delta I_N$ corresponds to a sum of one or more selected component currents $I_{N0}, \ldots, I_{N6}$ of IDAC1. An amount of the first offset compensation current drawn by IDAC1 212-1 is related to digital data $D_{N0-N6}$ stored in SAR1 216-1 and provided as input to IDAC1 212-1. Thus, referring to FIG. 2A, a first current, $I_1$, plus a first offset current, $\Delta I_N$, may flow through the first resistor, R1, that has resistance R. $V_{in}-$ may then correspond to $V_{in}- = V_{DD} - R(I_1 + \Delta I_N)$.

Similarly, IDAC2 212-2 is configured to supply a second offset compensation current, $\Delta I_p$, to the positive voltage port, Vin+, of the resistive bridge sensor 200. The second offset compensation current $\Delta I_p$ corresponds to a sum of one or more selected component currents $I_{P0}, \ldots, I_{P6}$ of IDAC2. An amount of the second offset compensation current output from IDAC2 212-2 is related to digital data $D_{P0-P6}$ stored in SAR2 216-2 and provided as input to IDAC2 212-2. Thus, referring to FIG. 2A, a second current, $I_2$ may flow through the third resistor, R3, that has resistance R+$\Delta$R, $\Delta I_p$ may flow into the Vin+ port, resulting a current flow through R4 of $I_2 + \Delta I_p$. $V_{in}+$ may then correspond to $V_{in}+ = R(I_2 + \Delta I_p)$.

During calibration operations, SAR controller circuitry 214 is configured to implement successive approximations and adjust the contents (i.e., data stored in each bit) of each SAR 216-1, 216-2 so that Vin+ and Vin− each approach $V_{CM}$. Adjusting the contents of each SAR corresponds to adjusting each current, $\Delta I_p$ and $\Delta I_N$.

Figure 3:
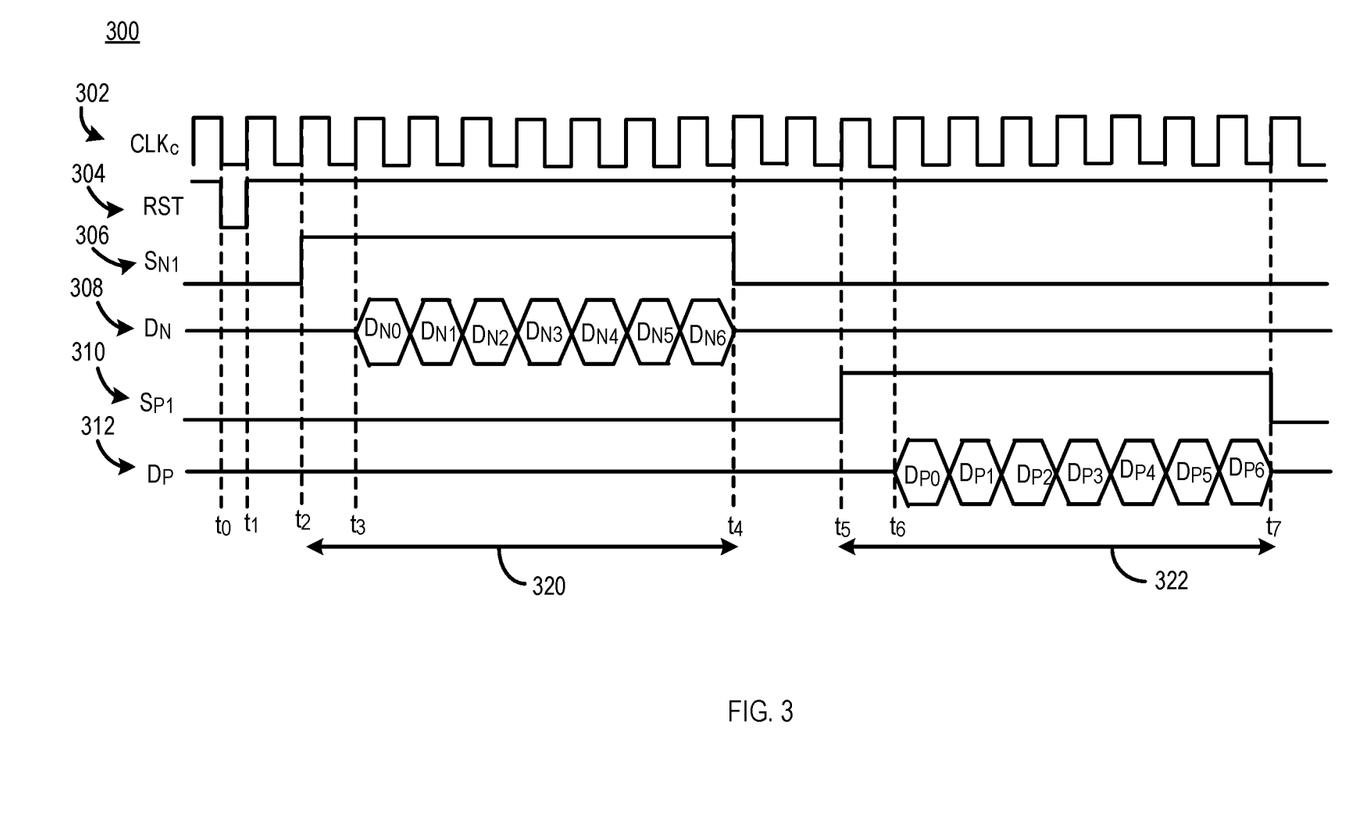
FIG. 3 is a timing diagram of bridge-offset calibration operations, according to an embodiment of the present disclosure.

FIG. 3 is a timing diagram 300 of bridge-offset calibration operations, according to an embodiment of the present disclosure. Timing diagram 300 includes a clock signal (CLKc) 302 and a reset signal (RST) 304. Timing diagram 300 further includes switch state signals ($S_{N1}$) 306 and ($S_{P1}$) 310 and data signals (DN) 308 and (DP) 312. The switch state signals 306, 310 correspond to the respective states of switches SN1 and SP1 and the data signals are related to operation of SAR1 and SAR2 of FIG. 2B. Timing diagram 300 includes a first calibration time interval 320 and a second calibration time interval 322.

The following description of operation of offset calibration circuitry 210 may be best understood when considering FIG. 2A, FIG. 2B and FIG. 3 together. At time t0, a reset pulse, e.g., a falling edge of reset signal (RST) 304, may be received by SAR controller circuitry 214, initiating offset calibration operations. RST 304 (and clock signal CLKc 302) may be received from, for example, system control module 102 of FIG. 1. At time t1, the RST signal 304 may return to a high state. At time t2, switch SN1 may be turned on (by, e.g., SAR controller circuitry 214), and may then couple the noninverting input of comparator 218 to an analog output of the first IDAC1 (and thus to the negative output Vin− of the resistive bridge sensor 200). Time t2 corresponds to a start of the first calibration time interval 320. In one nonlimiting example, time t2 may correspond to one clock period after the RST signal 304 returns to its normally high state. During the first calibration time interval 320, SAR controller circuitry 214 is configured to adjust each successive bit of SAR1 based, at least in part, on an output from comparator 218. Each bit adjustment is configured to occur in one clock period, starting at time t3. At time t4, switch SN1 is turned off and the first calibration interval ends.

At time t5, switch SP1 may be turned on (by, e.g., SAR controller circuitry 214), and may then couple the noninverting input of comparator 218 to an analog output of the second IDAC2 (and thus to the positive output Vin+ of the resistive bridge sensor 200). Time t5 corresponds to a start of the second calibration time interval 322. In one nonlimiting example, time t5 may correspond to two clock periods after t4, the end of the first calibration time interval 320. During the second calibration time interval 322, starting at time t6, SAR controller circuitry 214 is configured to adjust each successive bit of SAR2 based, at least in part, on an output from comparator 218. At time t7, switch SP1 is turned off and the second calibration interval ends.

Thus, at the completion of the second calibration interval, both switches SN1 and SP1 are open, decoupling the comparator 218 from the rest of the offset calibration circuitry. Such decoupling is configured to reduce power consumption.

Thus, during bridge-offset calibration operations, the SAR controller circuitry 214 is configured to adjust (e.g., set or clear) each bit of a plurality of bits of a respective SAR based, at least in part, on an output of the comparator 218, i.e., based, at least in part, on a comparison of the resistive bridge voltage output value and the common mode voltage, VCM. At the completion of the calibration operations, the binary contents of each SAR 216-1, 216-2 corresponds to a respective compensation current, and thus offset voltage, of a portion of the resistive bridge 200. The contents of each SAR 216-1, 216-2 is configured as a digital input to the respective IDAC 212-1, 212-2 and an output current $\Delta I_N$, $\Delta I_p$ of the respective IDAC is configured to compensate for the resistive bridge offset voltage. In one nonlimiting example, a resulting calibrated (i.e., compensated) offset voltage may be approximately one millivolt (mV).

Turning now to FIG. 2C, instrumentation amplifier 230 includes a differential difference amplifier (DDA) 232 that includes a first and a second differential input stage 234-1, 234-2 and a differential output stage 236. The first differential input stage 234-1 is coupled on its non-inverting input to interconnect node N13 and on its inverting input to interconnect node N23. A positive output port of the differential output stage 236 is coupled to interconnect node N31 and a negative output port of the differential output stage 236 is coupled to interconnect node N32. The DDA 232 may be coupled, at its output (i.e., interconnect nodes N31, N32), to a low pass filter-analog to digital converter stage, as will be described in more detail below.

The first differential input stage 234-1 is configured to receive the positive and negative outputs, Vin+ and Vin−, on its noninverting input port (interconnect node N13) and inverting input port (interconnect node N23), respectively. Thus, during operation, the interconnect node N13 is coupled to interconnect node N11 and interconnect node N23 is coupled to interconnect node N12 of FIG. 2A. The second differential input stage 234-2 is coupled to the differential output stage 236 via a feedback path that includes a feedback resistor network 238. The feedback resistor network 238 includes a first feedback resistor 238-1 with resistor value R1 coupled between the noninverting and inverting input ports of the second differential input stage 234-2. The feedback resistor network 238 further includes a second feedback resistor 238-2 with resistor value R2 and a third feedback resistor 238-3 with resistor value R2. The second feedback resistor 238-2 is coupled between the inverting input of the second differential input stage 234-2 and the positive output port of the differential output stage 236 (i.e., interconnect node N31). The third feedback resistor 238-3 is coupled between the noninverting input of the second differential input stage 234-2 and the negative output port of the differential output stage 236 (i.e., interconnect node N32). In one nonlimiting example, resistor value R1 may be 10 kiloohms (kΩ)) and resistor value R2 may be 100 kΩ achieving a corresponding differential gain of 26 decibels (dB). However, this disclosure is not limited in this regard. The DDA 232 is configured to have a relatively high input impedance to reduce loading at the front-end and may be further configured to isolate the currents from the IDAC1, and IDAC2 of the offset calibration circuitry 210.

Figure 4:
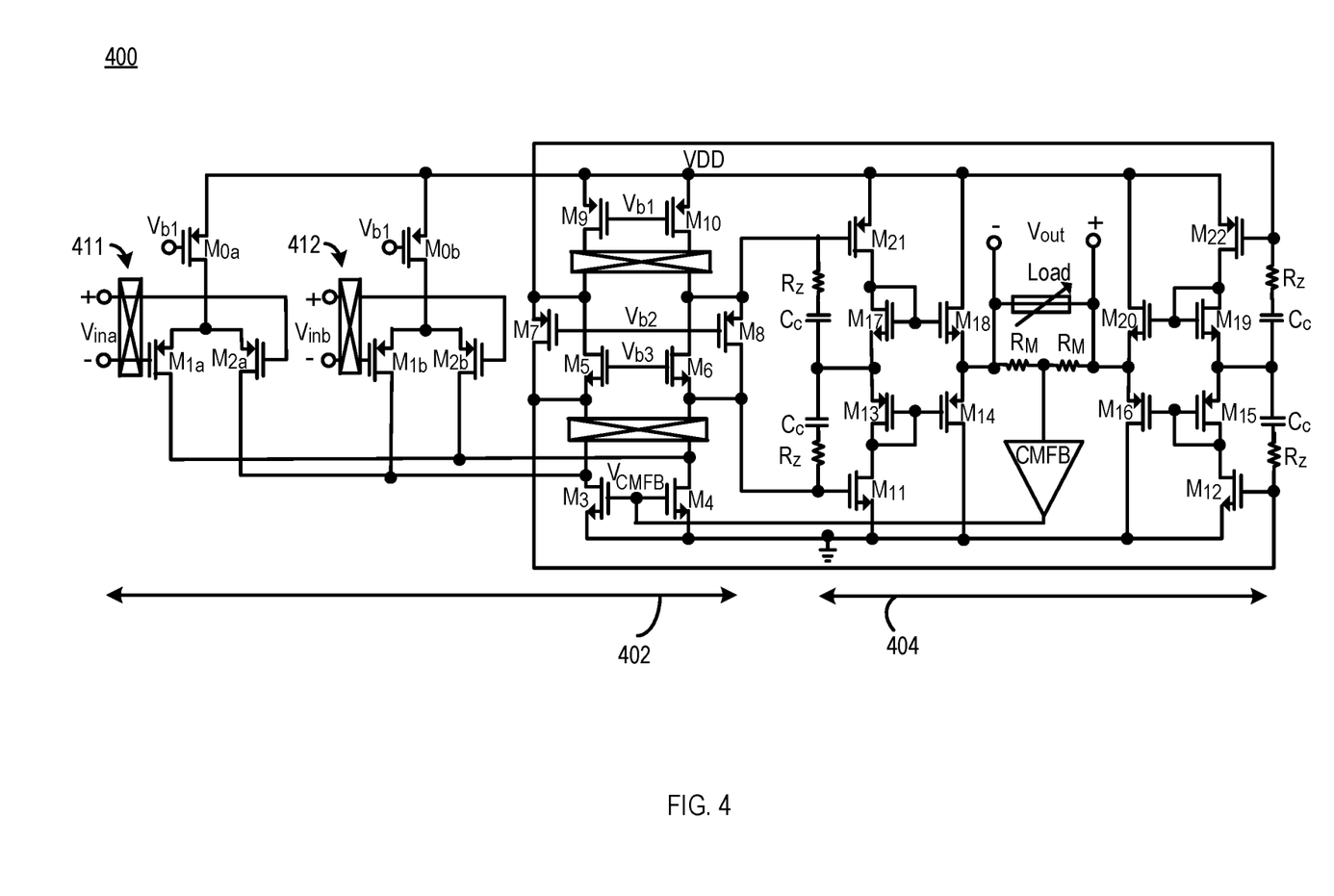
FIG. 4 illustrates one example differential difference amplifier including a super Class AB output stage, according to one embodiment of the present disclosure.

FIG. 4 illustrates one example differential difference amplifier (DDA) 400 including a super Class AB output stage, according to one embodiment of the present disclosure. DDA 400 is one example of DDA 232 of FIG. 2C. DDA 400 includes a first stage 402 and a second stage 404. The first stage 402 corresponds to a dual input and gain stage. The second stage 404 corresponds to a super class AB output stage.

The first stage 402 includes a first differential input stage 411 and a second differential input stage 412. The first stage 402 is formed by transistors M0$a$, M0$b$ to M10 and is configured to amplify the differential difference input. In one nonlimiting example, the gain may be on the order of 70 dB. The second stage 404, corresponding to a super class-AB output stage is configured to provide a relatively low output impedance. In one nonlimiting example, second stage 404 may have an output impedance (Rout) on the order of 100 kΩ. A DDA, consistent with the present disclosure, is configured to have a relatively low harmonic distortion. In one nonlimiting example, an instrumentation amplifier including the super class-AB output stage 404 may provide a total harmonic distortion (THD) on the order of −82 dB.

Turning now to FIG. 2D, LPF-ADC architecture 240 includes a low pass filter (LPF) 242, an analog to digital converter (ADC) 244 and successive approximation register (SAR) control logic 246. LPF 242 is configured to receive a differential input via interconnect nodes N41 and N42. LPF 242 is configured to be switchably coupled to ADC 244. The LPF-ADC architecture 240 includes switches SP2 and SN2 configured to switchably couple a differential output of LPF 242 to a differential input of ADC 244. ADC 244 is configured to provide a digital output 258 to SAR control logic 246. The digital output 258 corresponds to an output DOUT of the LPF-ADC architecture 240. DOUT may further correspond to a digital representation of the parameter (e.g., pressure) sensed by resistive bridge sensor 200.

SAR control logic 246 is configured to provide a duty cycle control signal 252 to LPF 242. SAR control logic 246 is further configured to provide a switch control signal 254 to switches SP2 and SN2 configured to couple and decouple LPF 242 and ADC 244. SAR control logic 246 is further configured to provide an ADC control signal 256 to ADC 244 and a clock signal to comparator 248 included in and/or coupled to ADC 244. The clock signal (CLK) may be received from, for example, system control module 102 of FIG. 1. SAR control logic 246 is configured to receive an ADC output signal 258 from comparator 248 and to provide a data out signal DOUT to, for example, a system control module.

The LPF 242 includes a differential amplifier 243 that has a differential output. The LPF 242 includes two input resistors R11 and R12 with variable resistance values, Ri, switchably coupled to a noninverting and an inverting input, respectively, of the differential amplifier 243. The first input resistor R11 is coupled to interconnect node N41 and the second input resistor R12 is coupled to interconnect node N42. Interconnect node N41 is configured to couple to interconnect node N31 and interconnect node N42 is configured to couple to interconnect node N32, of the instrumentation amplifier 230 FIG. 2C.

LPF 242 further includes a first feedback network coupled between the noninverting input and a negative output port of the amplifier 243 and a second feedback network coupled between the inverting input and a positive output port of the amplifier 243. The first feedback network includes a feedback resistor R21, with a resistance value Rf, a capacitor C11, with capacitance value Cf, and a switch S11. The second feedback network includes a feedback resistor R22 with a resistance value Rf, a capacitor C12, with capacitance value Cf, and a switch S12. Switch S11 is configured to switchably couple resistor R21 to the noninverting input of amplifier 243. Switch S21 is configured to switchably couple resistor R22 to the inverting input of amplifier 243. A third switch S22 is configured to switchably couple the input resistors R11 and R12. In one nonlimiting example, the feedback resistance value Rf is 9 mega ohms (MΩ) and the feedback capacitance value Cf is 9 picofarads (pF). However, this disclosure is not limited in this regard.

ADC 244 includes a comparator 248, a first switched capacitor network 250-1 coupled to a noninverting input of comparator 248 and a second switched capacitor network 250-2 coupled to an inverting input of comparator 248. The first switched capacitor network 250-1 is switchably coupled by switch SP2 to the negative output port of amplifier 243. The second switched capacitor network 250-2 is switchably coupled by switch SN2 to the positive output port of amplifier 243. Each capacitor network 250-1, 250-2 includes a plurality of capacitors C0, C1, . . . , C9 coupled in parallel. Thus, ADC 244 may be understood as a 10 bit ADC. Capacitor C9 of each capacitor network 250-1, 250-2 is coupled to a reference voltage VREF. In one nonlimiting example, VREF=VDD/2. Capacitors C0, C1, . . . , C8 of each capacitor network 250-1, 250-2 are switchably coupled to VREF or to ground. An output of comparator 248 is coupled to SAR control logic 246. In one nonlimiting example, a capacitance of each capacitor $C_i$ is equal to two times the capacitance of capacitor $C_{i+1}$, for i=0, 1, . . . , 7, and a capacitance of capacitor C8 is equal to a capacitance of capacitor C9.

Figure 5A:
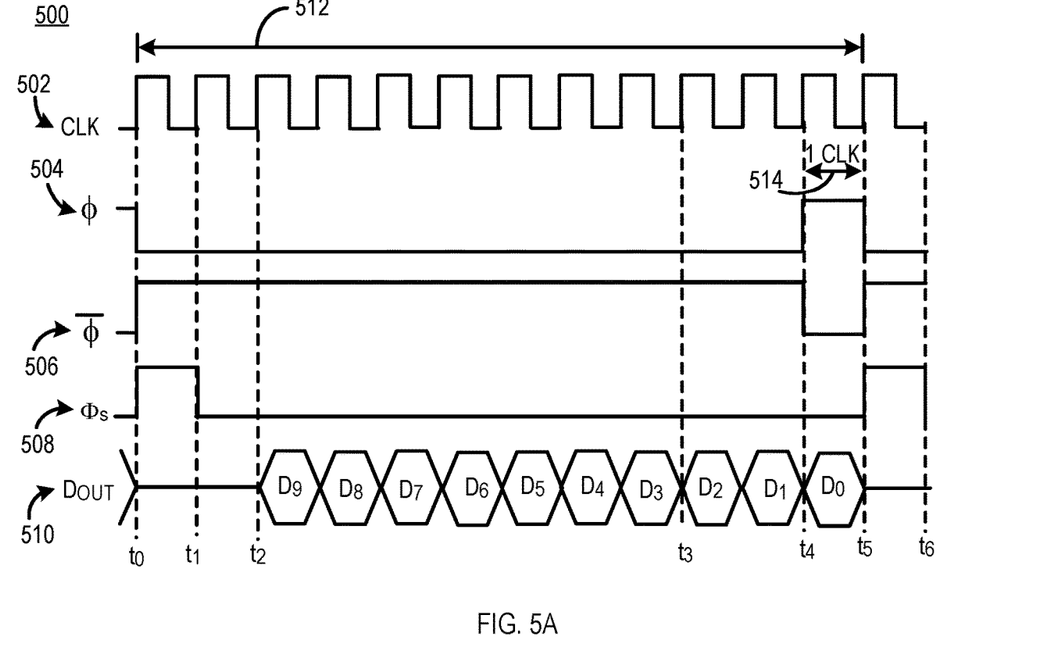
FIG. 5A is a timing diagram of one example low pass filter (LPF) and analog to digital conversion (ADC) operations, according to one embodiment of the present disclosure.

Operation of the LPF-ADC architecture 240 may be best understood when considering FIGS. 2D and 5A together. SAR control logic 246 is configured to provide a duty cycle control signal 252 to LPF 242. The duty cycle control signal 252 includes the first switch control signal (φ) and the second switch control signal ($\bar{\phi}$). In this example, the duty cycle, d, of the duty cycle control signal is 1/12, where the duty cycle controlled bandwidth of the LPF may be written as $$\frac{d}{R_f C_f}.$$

control logic is runner configured to provide a third switch control signal (Φs) 254 to switches SN2 and SP2 that switchably couple the LPF 242 to the ADC 244. SAR control logic 246 is configured to receive the clock signal (CLK) from a system control module and to provide the digital output signal DOUT to the system control module.

LPF-ADC 240 corresponds to a duty-cycle controlled architecture with the digitization achieved through a monotonic-switching 10-bit SAR ADC 244 and a synchronous timing. In an embodiment, SAR control logic 246 may correspond to SAR controller circuitry 214 of FIG. 2B.

Using the duty-cycle control clocks (ϕ) and (ϕ̄) in the LPF 242, the system can achieve a bandwidth reduction from $$\frac{1}{R_f C_f} \text{ to } \frac{1/12}{R_f C_f}$$

without using resistors and capacitors. Avoiding the use of resistors and capacitors in LPF 242 and reusing SAR controller circuitry are configured to reduce the form factor and may thus facilitate miniaturization of front end circuitry that includes LPF 242. The variable resistance, Ri, of input resistors R11 and R12 is configured to provide a programmable gain (Rf/Ri). For example, the gain may be selected from the group including 6 dB, 10 dB, 12 dB, 14 dB. However, this disclosure is not limited in this regard.

Turning now to FIG. 5A, FIG. 5A is a timing diagram 500 of one example LPF and ADC operations, according to one embodiment of the present disclosure. Timing diagram 500 includes a clock (CLK) signal 502, a first switch control signal (ϕ) 504, a second switch control signal (ϕ̄) 506, and a third switch control signal (Φs) 508. Timing diagram 500 further includes an output signal (DOUT) 510. Timing diagram 500 includes time interval 512 corresponding to one analog to digital conversion period. The clock signal 502 is periodic with one clock period corresponding to time interval 514. In this example, the time interval 512 contains 12 clock cycles (i.e., clock periods) 514. However, this disclosure is not limited in this regard.

Prior to time t0, the first switch control signal (ϕ) is high (i.e., switches S11 and S12 are closed) and the second switch control signal (ϕ̄) and the third switch control signal (Φs) are low (i.e., switches S22, SP2 and SN2 are open). At time t0, the first switch control signal 504 transitions high to low thus opening switches S11 and S12, the second switch control signal 506 transitions low to high thus closing switch S22. Further at time t0, the third switch control signal 508 transitions from low to high, closing switches SN2 and SP2.

At time t1, one clock cycle from time t0, the third switch control signal 508 transitions from high to low, opening switches SN2 and SP2. At time t2, one clock cycle from time t1, a digital output, DOUT corresponding to a low pass filtered output of LPF 242 captured during the time interval between t0 and t1, begins to be output from comparator 248 and SAR control logic 246. For example, SAR control logic 246 may be configured to provide DOUT to a system control module. At time t3, ADC conversion operations continue.

At time t4, 11 clock cycles form time t0 in this example, the first switch control signal 504 transitions low to high thus closing switches S11 and S12, the second switch control signal 506 transitions high to low thus opening switch S22. Operations at time t5 correspond to operations at time t0. At time t5, the first switch control signal 504 transitions high to low thus opening switches S11 and S12, the second switch control signal 506 transitions low to high thus closing switch S22. Further at time t5, the third switch control signal 508 transitions from low to high, closing switches SN2 and SP2. Time t5 corresponds to an end of one conversion interval, thus, one conversion time interval begins at time t0 and extends to time t5. Operations at time t6 correspond to operations at time t1.

Thus, a bandwidth of LPF 242 may be controlled by controlling a duty cycle of at least switches S11, S12 and S22 and a conversion interval of ADC 244 may be similarly controlled b controlling at least switches SP2 and SN2.

Figure 5B:
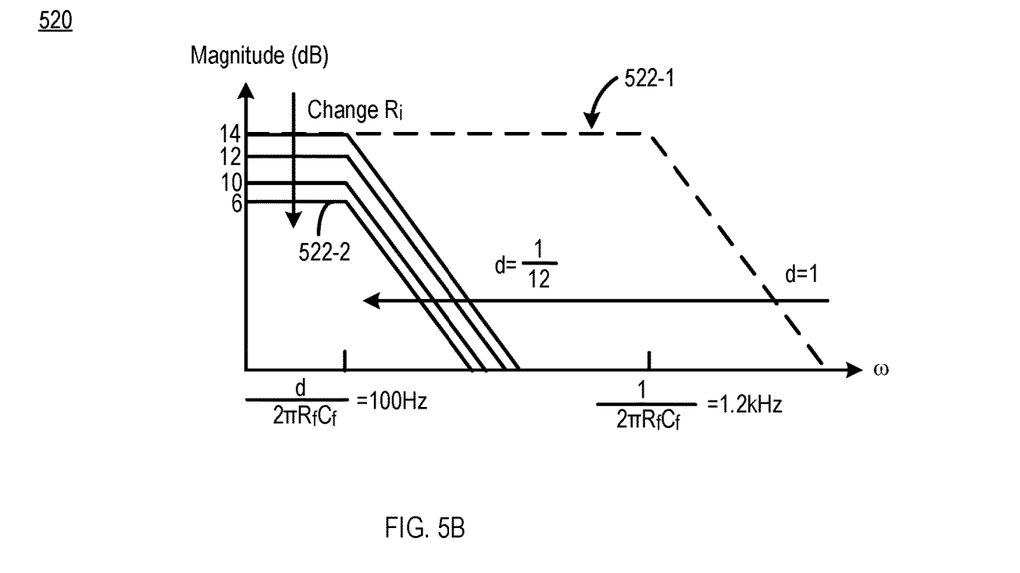
FIG. 5B is a plot illustrating a frequency response of a LPF-ADC stage, according to an embodiment of the present disclosure.

FIG. 5B is a plot 520 illustrating a frequency response of a LPF-ADC stage, according to an embodiment of the present disclosure. In the plot 520, a vertical axis corresponds to magnitude in decibels (dB) and a horizontal axis corresponds to angular frequency (ω). The plot 500 includes a plurality of frequency responses, e.g., a first frequency response 522-1 and a second frequency response 522-2. As illustrated by plot 500, a magnitude of a passband is related to a value of input resistance, Ri. As further illustrated by plot 500, a bandwidth of the passband is related a duty cycle, d.

In the plot 520, the first frequency response 522-1 has a passband gain of 14 dB and the second frequency response 522-2 has a passband gain of 6. The passband gain may be selected by selecting resistance value Ri for input resistors R11 and R12 of FIG. 2D. Further in the plot 520, the first frequency response 522-1 has a cutoff frequency of ½πRfCf, corresponding to a duty factor of 1. In one nonlimiting example, the cutoff frequency of the first frequency response 522-1 may have a value of 1.2 kilohertz (kHz). However, this disclosure is not limited in this regard. Further in the plot 520, the second frequency response 522-2 has a cutoff frequency of (d=1/12)/2πRfCf, corresponding to a duty factor of 1/12. In one nonlimiting example, the cutoff frequency of the second frequency response 522-2 may have a value of 100 Hz. However, this disclosure is not limited in this regard.

Thus, LPF-ADC circuitry 240 may be configured to utilize duty cycle control to set and/or adjust a bandwidth of LPF 242 and avoiding use of space consuming resistors and capacitors. LPF circuitry 242 may further include variable resistance input resistors thus provided an adjustable gain for LPF 242. LPF-ADC circuitry 240 may be further configured to re-use SAR controller circuitry 214 to perform operations of SAR control logic, as described herein.

Figure 6:
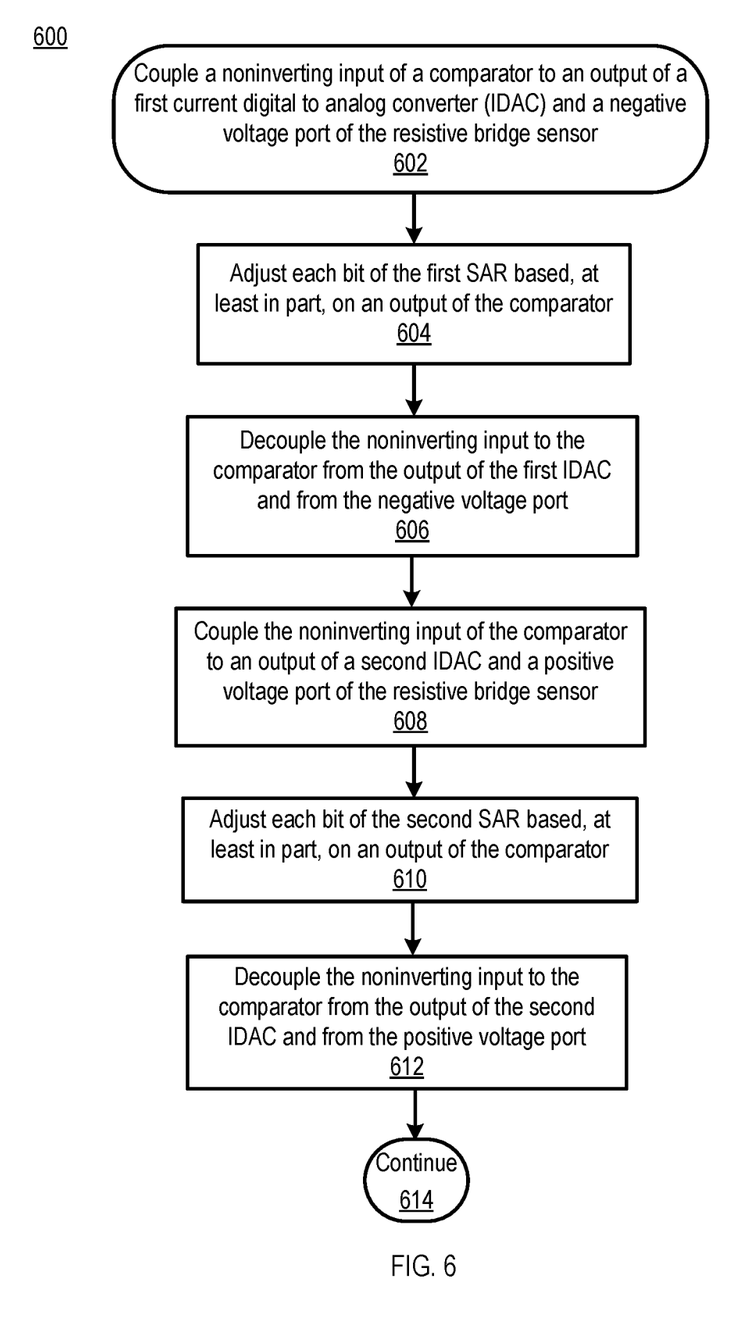
FIG. 6 is a flowchart of calibration operations according to various embodiments of the present disclosure.

FIG. 6 is a flowchart of calibration operations according to various embodiments of the present disclosure. In particular, the flowchart 600 illustrates compensating offset voltage of a resistive bridge sensor. The operations may be performed, for example, by offset calibration circuitry 150 of FIG. 1 and/or example offset calibration circuitry 210 of FIG. 2B.

Operations of this embodiment may be initiated in response to a reset signal received from, for example, a system control module. Operation 602 may include coupling a noninverting input of a comparator to an output of a first current digital to analog converter (IDAC) and a negative voltage port of the resistive bridge sensor. The first IDAC may be coupled to a first successive approximation register (SAR). Operation 604 includes adjusting each bit of the first SAR based, at least in part, on an output of the comparator. The comparator is configured to compare a voltage on the negative voltage port to a common mode voltage. Operation 606 includes decoupling the noninverting input to the comparator from the output of the first IDAC and from the negative voltage port. Operation 608 includes coupling the noninverting input of the comparator to an output of a second IDAC and a positive voltage port of the resistive bridge sensor. The second IDAC is coupled to a second SAR. Operation 610 includes adjusting each bit of the second SAR based, at least in part, on an output of the comparator. The comparator is configured to compare a voltage on the positive voltage port to the common mode voltage. Operation 612 includes decoupling the noninverting input to the comparator from the output of the second IDAC and from the positive voltage port. Program flow may then continue at operation 614.

Thus, offset voltage of a resistive bridge sensor may be calibrated and compensation current may be determined configured to reduce the resulting offset voltage.

Thus, an apparatus, method and/or system, according to the present disclosure, may be relatively low power, have a relatively small form factor and may be relatively inexpensive. The apparatus, method and/or system may then be configured to be worn by a test subject in order to capture, for example, an APW.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may include, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

Memory 112 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An offset calibration circuitry configured to compensate an offset voltage of a resistive bridge sensor of an arterial pulse waveform sensing system, the sensing system comprising a control system module coupled to a sensing module, the sensing module being wearable on the neck or wrist of a subject, wherein the control system module is configured to transmit control signals to the sensing module and the sensing module is configured to transmit pulse waveform data from the sensing module to the system control module, the sensing module comprising the resistive bridge pressure sensor and front end circuitry, the front end circuitry comprising the offset calibration circuitry which comprises:
a first current digital to analog converter (IDAC) coupled to a first successive approximation register (SAR) and configured to couple to a negative voltage port of a resistive bridge sensor, the first SAR configured to store a first digital value;
a second IDAC coupled to a second SAR and configured to couple to a positive voltage port of the resistive bridge sensor, the second SAR configured to store a second digital value; and
an SAR controller circuitry configured to adjust each bit of the first SAR and each bit of the second SAR based, at least in part, on an output of a comparator, the comparator configured to compare a voltage on the negative voltage port or a voltage on the positive voltage port to a common mode voltage.

2. The offset calibration circuitry of claim 1, wherein the comparator is switchably coupled to the negative voltage port or to the positive voltage port during calibration operations and is decoupled from the negative voltage port and the positive voltage port otherwise.

3. The offset calibration circuitry of claim 1, wherein the first digital value corresponds to a first compensation current and the second digital value corresponds to a second compensation current, the compensation currents related to at least one offset voltage of the resistive bridge sensor.

4. The offset calibration circuitry of claim 1, wherein the SAR controller circuitry is configured to initiate the adjusting in response to a reset signal.

5. The offset calibration circuitry according to claim 1, wherein the common mode voltage is configured to be one half of a supply voltage.

6. The offset calibration circuitry according to claim 1, wherein each bit is adjusted in a respective clock period.

7. The offset calibration circuitry according to claim 1, wherein each SAR contains seven bits.

8. A method of offset calibration for a resistive bridge sensor of an arterial pulse waveform sensing system, the sensing system comprising a control system module and a sensing module coupled to the control system module and in which the sensing module is sized to be worn on the wrist or neck of a subject, wherein the control system module is configured to transmit control signals to the sensing module and the sensing module is configured to transmit arterial pulse waveform data from the sensing module to a processor of the control system module, the sensing module comprising the resistive bridge sensor and front end circuitry, the method comprising:
coupling, by a first switch, a noninverting input of a comparator to an output of a first current digital to analog converter (IDAC) and a negative voltage port of the resistive bridge sensor, the first IDAC coupled to a first successive approximation register (SAR) within the sensing module;

adjusting, by an SAR controller circuitry further disposed in the sensing module, each bit of the first SAR based, at least in part, on an output of the comparator, the comparator configured to compare a voltage on the negative voltage port to a common mode voltage;

decoupling, by the first switch, the noninverting input to the comparator from the output of the first IDAC and from the negative voltage port;

coupling, by a second switch, the noninverting input of the comparator to an output of a second IDAC and a positive voltage port of the resistive bridge sensor, the second IDAC coupled to a second SAR;

adjusting, by the SAR controller circuitry, each bit of the second SAR based, at least in part, on an output of the comparator, the comparator configured to compare a voltage on the positive voltage port to the common mode voltage;

decoupling, by the second switch, the noninverting input to the comparator from the output of the second IDAC and from the positive voltage port.

9. The method of claim 8, wherein the resistive bridge sensor is configured to sense pressure, humidity or temperature.

10. The method of claim 8, wherein each bit is adjusted in a respective clock period.

11. The method of claim 8, wherein, after each adjusting, the first SAR is configured to store a first digital value corresponding to a first compensation current and the second SAR is configured to store a second digital value corresponding to a second compensation current, the compensation currents related to at least one offset voltage of the resistive bridge sensor.

12. The method of claim 8, wherein each adjusting is initiated in response to a reset signal.

13. The method of claim 8, wherein each SAR contains seven bits.

14. An arterial pulse waveform (APW) sensing system comprising:

a control system module and a sensing module coupled to the control system module, the control system module providing control signals to the sensing module and the sensing module providing APW data from the sensing module to the control system module, wherein the sensing module is wearable on the neck or wrist of a subject and comprises a front end circuitry, the front end circuitry comprising an offset calibration circuitry comprising:

a first current digital to analog converter (IDAC) coupled to a first successive approximation register (SAR) and configured to couple to a negative voltage port of a resistive bridge pressure sensor of the sensing module, the first SAR configured to store a first digital value, a second IDAC coupled to a second SAR and configured to couple to a positive voltage port of the resistive bridge sensor, the second SAR configured to store a second digital value, and an SAR controller circuitry configured to adjust each bit of the first SAR and each bit of the second SAR based, at least in part, on an output of a comparator, the comparator configured to compare a voltage on the negative voltage port or a voltage on the positive voltage port to a common mode voltage;

an instrumentation amplifier configured to couple to the negative voltage port and the positive voltage port of the resistive bridge sensor;

a low pass filter with a duty cycle controlled bandwidth; and an analog to digital converter.

15. The arterial pulse waveform sensing system of claim 14, wherein the front end circuitry of the wearable sensing module further comprises bandgap (BGP) circuitry, buffer circuitry, and low drop out (LDO) circuitry configured to provide a temperature independent supply voltage.

16. The arterial pulse waveform sensing system of claim 14, wherein the SAR controller circuitry is further configured to provide a duty cycle control signal to the low pass filter.

17. The arterial pulse waveform sensing system according to claim 14, wherein the comparator is switchably coupled to the negative voltage port or to the positive voltage port during calibration operations and is decoupled from the negative voltage port and the positive voltage port otherwise.

18. The arterial pulse waveform sensing system according to claim 14, wherein the first digital value corresponds to a first compensation current and the second digital value corresponds to a second compensation current, the compensation currents related to at least one offset voltage of the resistive bridge sensor.

19. The arterial pulse waveform sensing system according to claim 14, wherein each bit is adjusted in a respective clock period.

* * * * *